Figure 1:
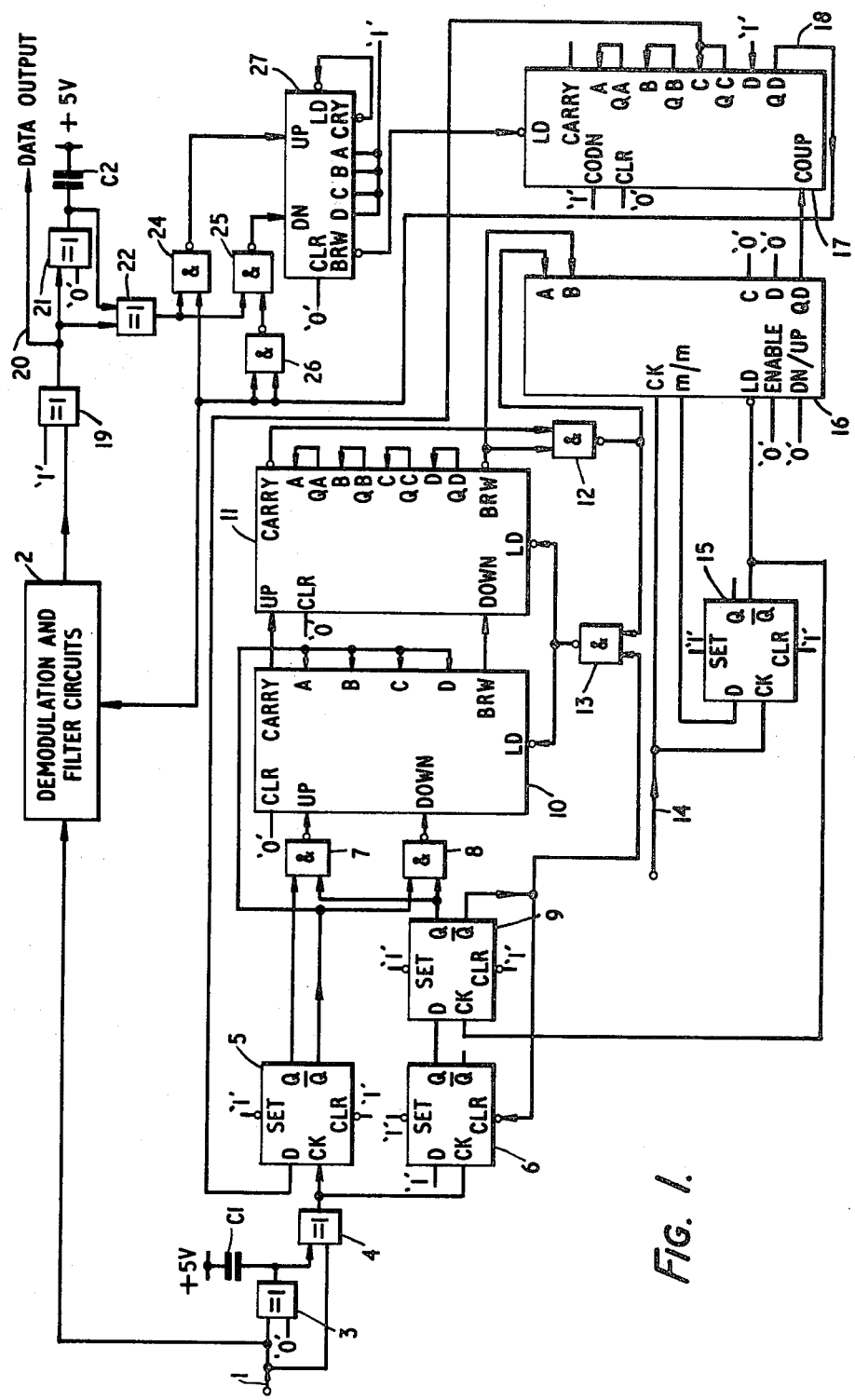

United States Patent [19]

Wright

[11] 4,330,863
[45] May 18, 1982

[54] DEMODULATOR ARRANGEMENT

[76] Inventor: Simon C. M. Wright, Ave. desGrives 3, Braine-l'Allend 1420, Belgium

[21] Appl. No.: 190,312

[22] PCT Filed: Jul. 5, 1979

[86] PCT No.: PCT/GB79/00113
§ 371 Date: Mar. 7, 1980
§ 102(e) Date: Mar. 4, 1980

[30] Foreign Application Priority Data

Jul. 7, 1978 [GB] United Kingdom ............... 29121/78

[51] Int. Cl.³ .................... H03D 3/24; H03D 3/22
[52] U.S. Cl. ...................................... 375/81; 329/122; 375/84
[58] Field of Search ............... 375/106, 110, 118, 119, 375/120, 81, 82, 84, 85; 455/75, 113, 119; 331/1 A, 18; 329/50, 104, 122; 370/100; 328/63, 72, 74, 75, 155

[56] References Cited

U.S. PATENT DOCUMENTS

| | | | |
|---|---|---|---|
| 3,439,283 | 4/1969 | Danielson | 375/80 X |
| 3,936,762 | 2/1976 | Cox, Jr. et al. | 329/104 |
| 4,030,045 | 6/1977 | Clark | 329/122 |
| 4,105,979 | 8/1978 | Kage | 328/74 |
| 4,112,383 | 9/1978 | Burgert | 329/122 |

Primary Examiner—Benedict V. Safourek
Attorney, Agent, or Firm—Mason, Fenwick & Lawrence

[57] ABSTRACT

A demodulator arrangement having a demodulator and a digital phase locked loop responsive to input diphase digitally modulated signals to produce output signals which are applied to the demodulator for effecting the demodulation of the input signals. The phase locked loop includes a phase comparator in which the timing of transitions in the input signals is compared with the timing of transitions in the output signals obtained from a clock signal by means of a variable divider and a counter arranged to count upwards and downwards selectively the outputs of the phase comparator and adjust the variable division factor in accordance with the total recorded by the counter so as to tend to synchronize the output signal with the input signals. A phase adjustment circuit is provided responsive to the output of the demodulator and the output signals of the digital phase locked loop to correct the phase of the output signals. In the phase adjustment circuit, phase errors are counted and when sufficient have occurred the phase jump is caused by altering a counter in the variable divider.

6 Claims, 3 Drawing Figures

DEMODULATOR ARRANGEMENT

This invention relates to a demodulator arrangement having a demodulator and a digital phase locked loop responsive to input diphase digitally modulated signals to produce output signals which are applied to the demodulator for effecting the demodulation of the input signals.

There are many circumstances in which it is required to generate an electrical waveform synchronised with the timing of another waveform and it is known to use a digital phase-locked loop for this purpose. One known way of performing a phase correction in a digital phase-locked loop is to gate a pulse into or out of a frequency divider within the loop. Another known technique is to use a dividing stage of adjustable dividend comprising a series of cascade-connected divide-by-two units, the cascade connection being adjustably pre-set.

In some applications, such as diphase transmission and reception, very high data rates (for example 48 kilobits per second are employed. One problem of phase synchronisation at high date rates is that of phase jitter on the synchronised waveform. If phase correction is applied for all phase discrepancies (even very small ones) excessive amounts of phase jitter are likely to be generated. On the other hand, responsiveness may be lost if a correction signal is generated only for phase discrepancies of greater than a fairly large predetermined value.

Examples of prior art digital phase-locked loops may be found in U.K. Pat. Nos. 1,355,028 and 1,389,127, the article "Low-power digital phase locked loop utilizes CMOS logic" by David A. Johnson in ELECTRICAL DESIGN NEWS, Vol. 17, no. 6 Mar. 15, 1972, the article "Optimum Estimation of Bit Synchronization" by Alan L. McBride and Andrew P. Sage in IEEE TRANSACTIONS ON AEROSPACE AND ELECTRONIC SYSTEMS Vol. AES-5 no. 3, May 1969, the article "A Wide Band all Digital Phase-Locked Loop" by Hisas Yamamoto in ABSTRACTS OF IECE TRANSACTIONS, Vol. 58, no. 3, March 1975, in the article "Phase Noise and Transient Times for a Binary Quantized Digital Phase-Locked Loop in White Gaussian Noise" by James R. Cessna and Donald M. Levy in IEE TRANSACTIONS ON COMMUNICATIONS Vol. COM-20, no. 2 April 1972, in the article "A High Precision Phase Lock Loop" by J. P. Gonyet in CONFERENCE ON FREQUENCY GENERATION AND CONTROL FOR RADIO SYSTEMS May 22–24, 1967, and in U.S. Pat. Nos. 3,562,661; 3,916,324 and 3,209,265.

The article by David A. Johnson describes a system in which a phase comparator provides information to an up-down counter as to whether the phase of incoming data is increasing, decreasing or constant as compared to a local data clock. A high-speed local clock waveform and a variable divider are used to generate the local data clock. Timing information from an incoming signal is obtained by generating a timing-reference pulse for each signal-level transmission. The timing-reference pulses should occur at the falling edge of a clock pulse and if a timing-reference pulse is coincident with the more positive half of the data clock, a count-up command is generated, and if a timing-reference pulse is coincident with the more negative half, a count-down command is generated. These commands are presented to an up-down counter and control logic responsive to the counter controls the variable divider. This system is not, however, adapted to the needs of a diphase system.

Other systems employing digital phase-locked loops are described in the remaining documents listed above but none provides a high quality timing circuit suited to a diphase system.

The invention as claimed is intended to solve the problem of providing a high quality timing circuit specifically suitable for diphase reception which is at the same time relatively simple and inexpensive.

The present invention provides a demodulator arrangement having a demodulator and a digital phase locked loop responsive to input diphase digitally modulated signals to produce output signals which are applied to the demodulator for effecting the demodulation of the input signals, the phase locked loop including a multiplicity of digital counting stages arranged as a variable frequency divider to produce a frequency-divided output from a clock signal, the division ratio of the frequency divider being settable to either, or any one, of at least two values, a phase comparator arranged to make repeated comparisons of the timing of transitions in the output of the frequency divider with the timing of transitions in the input signals, and to produce on each comparison a first signal if the frequency divider output is leading the input signals and a second signal if the frequency divider output is lagging the input signals, said timing comparison means comprising a first D-type bistable circuit and a transition detector circuit, the output of the transition detector circuit being connected to the CLOCK input of the bistable circuit, and the D input of the bistable circuit being connected to receive inputs at the times of transitions in the output of the frequency divider, counter means connected to the output of the timing comparison means to count in one direction in response to the first signal and to count in the opposite direction in response to the second signal, and division ratio setting means to set the division ratio at a first, higher, value if the value in the counter means exceeds a threshold in the one direction, and at a second lower value if the value in the counter means exceeds the threshold in the opposite direction, wherein the arrangement includes a phase adjustment circuit responsive to the output of the demodulator and the output signals of the digital phase locked loop to correct the phase of the output signals of the phase locked loop.

The invention provides a simple and effective way of ensuring that the demodulating waveform has the correct phase relationship to the diphase signal to be demodulated. Advantageously, said means to determine whether the output waveform has a predetermined logic level comprises a further transition detector connected to the output of the diphase demodulation circuit, first logic gate means connected to receive the said output waveform and the output of the further transition detector and responsive to the said predetermined logic level, second logic gate means connected to receive the said output waveform and the output of the further transition detector and responsive to said complementary logic level, and first UP/DOWN counter means having its UP and DOWN inputs connected respectively to the outputs of the said first and second logic gate means. Preferably, said integrator means comprises second UP/DOWN digital counter means, the first signal is a count-in-one-direction pulse, the second signal is a count-in-the-opposite-direction pulse, and the means to invert the phase of the said output waveform comprises a connection from an output of the first UP/DOWN digital counter means to a LOAD control input of the second UP/DOWN digital counter means and comprises a source of the said predetermined logic level connected to a LOAD input of the second UP/DOWN digital counter means.

The division ratio of the frequency divider can be settable to any one of at least three values and the division ratio setting means can be arranged to set the division ratio at a third value, lower than the second value, if the integrated value exceeds a second threshold in the opposite direction, the second threshold being on the opposite direction side of the first threshold, and at the second value if the integrated values lies between the two thresholds.

Said second UP/DOWN digital counter means can comprise first and second UP/DOWN digital counters, the output of the timing comparison means being connected to the input of the first counter, the output of the first counter being connected to the input of the second counter, and means being provided to enter a first predetermined count in the first counter when the first threshold is exceeded in the one direction and to enter a second predetermined count in the first counter when the second threshold is exceeded in the opposite direction, the first count being on the opposite direction side of the second count. Said first digital counter can have a MAX/MIN output connected to the D input of a second D-type bistable circuit, a source of clock pulses can be connected to a CLOCK input of the first digital counter and the CLOCK input of the second D-type bistable circuit, the output of the first transition detector can be connected to the CLOCK input of a third D-type bistable circuit, an output of the third D-type bistable circuit can be connected to the D input of a fourth D-type bistable circuit, an output of the fourth D-type bistable circuit can be connected to a CLEAR input of the third D-type bistable circuit, an output of the second D-type bistable circuit can be connected to the CLOCK input of the fourth D-type bistable circuit, and the fourth D-type bistable circuit can be arranged to supply pulses to be counted to the first digital counter.

The multiplicity of digital counting stages can be an integrated circuit (IC) digital counter having a LOAD input and the division ratio setting means can be arranged to load the IC digital counter with either, or any one, of at least two predetermined counts at the beginning of each counting cycle.

Figure 2:
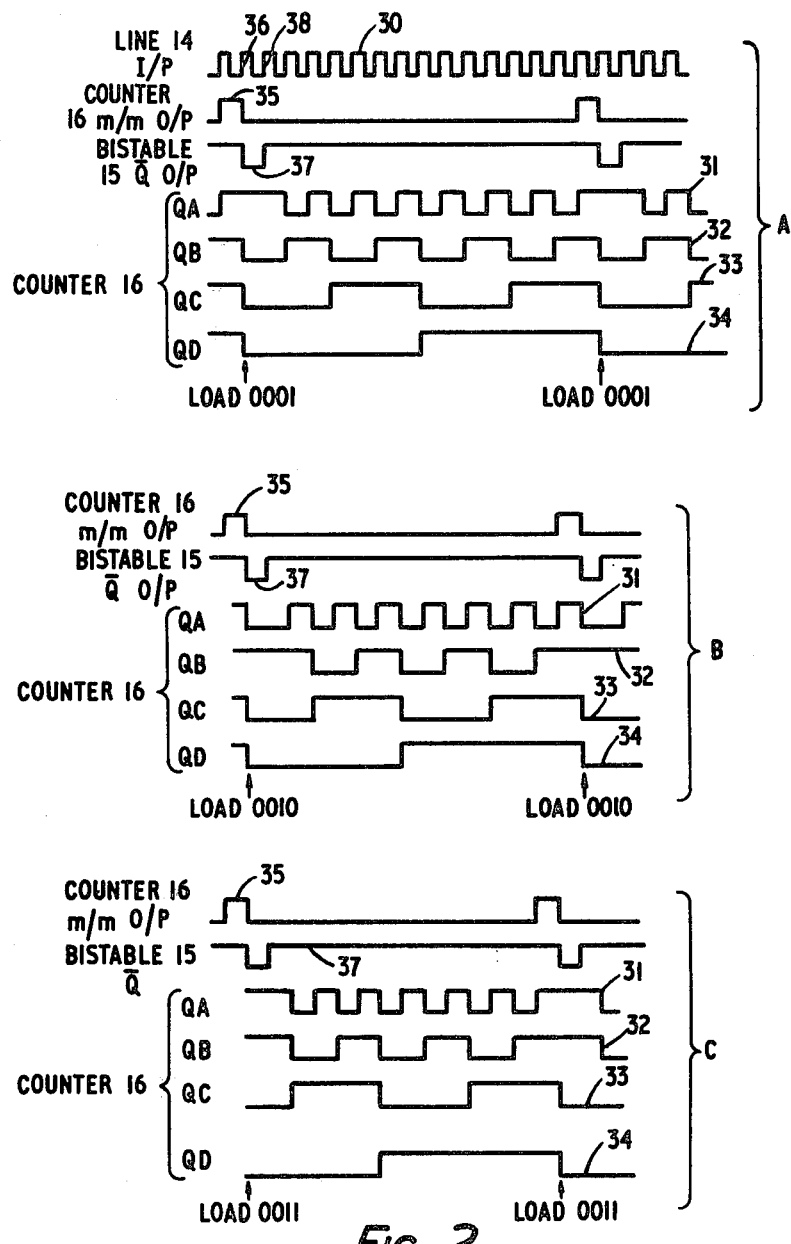
Figure 3:
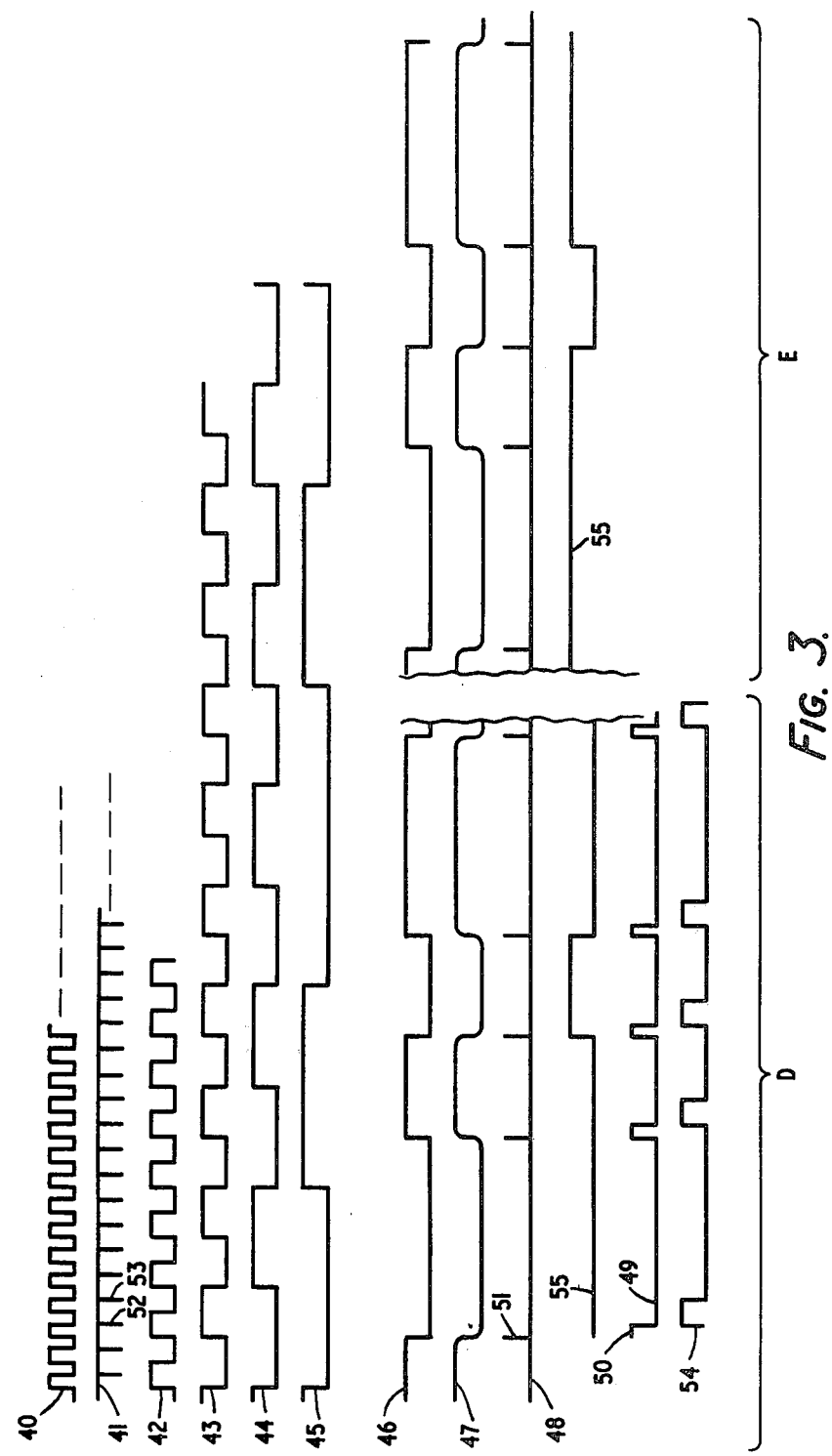

By way of example only, an illustrative embodiment of the invention will now be described with reference to the accompanying drawings, in which:

FIG. 1 shows a demodulating signal generating circuit for a diphase modulation receiver, and FIGS. 2 and 3 show waveforms appertaining to the circuit of FIG. 1.

Referring to the FIG. 1, a demodulating signal generating circuit is shown which forms part of a receiver for use with the diphase transmission methods described in U.S. Pat. Nos. 1,368,068 and 1,368,069. Apart from the demodulating signal generating circuit the receiver will not be described in detail since the remainder of its circuit is constructed in known manner.

Reference 1 shows a line carrying a received signal after preliminary amplification and filtering and ready for demodulation. Line 1 is connected to demodulation and filter circuits 2 of the receiver and also to one input of a first exclusive-OR gate 3. The other input of the gate 3 has logic '0' applied to it. The output of gate 3 is connected to one end of a 4.7 nanofarad capacitor C1 and also to one input of second exclusive-OR gate 4. The other end of capacitor C1 is connected to +5 volts and the other input of gate 4 is connected to receive the signal from line 1.

A type SN 7486J integrated circuit is used to implement the gates 3 and 4.

The output of gate 4 is connected to the CLOCK input of a first D-type bistable circuit 5 and also to the CLOCK input of a second D-type bistable circuit 6. Logic '1' is applied to the SET inputs of circuits 5 and 6, the CLEAR input of circuit 5 and the D input of circuit 6.

The Q output of circuit 5 is connected to one input of a first two-input NAND gate 7 and its $\overline{Q}$ output is connected to one input of a second two-input NAND gate 8.

The Q output of circuit 6 is connected to the D input of a third D-type bistable circuit 9 which has its Q output connected to the other inputs of both gates 7 and 8. The $\overline{Q}$ output of circuit 9 is connected to the CLEAR input of circuit 6 and logic '1' is applied to the SET and CLEAR inputs of circuit 9. Type SN74LS74J integrated circuits are used to implement the circuits 5, 6 and 9.

The outputs of NAND gates 7 and 8 are connected respectively to the UP and DOWN inputs of a first UP/DOWN counter 10. The $\overline{Q}$ output of circuit 5 is commonly connected to the A, B, C and D inputs of the counter 10. Logic '0' is applied to the CLEAR input of counter 10.

The CARRY and BORROW outputs of counter 10 are connected respectively to the UP and DOWN inputs of a second UP/DOWN counter 11. Type SN 74L193J integrated circuits are used to implement the counters 10 and 11. The QA, QB, QC and QD outputs of counter 11 are connected respectively to the A, B, C and D inputs of that counter. The CARRY and BORROW outputs of counter 11 are connected to respective inputs of a third two-input NAND gate 12.

A fourth two-input NAND gate 13 has its output connected to the LOAD input of both counters 10 and 11, the $\overline{Q}$ output of circuit 9 is connected to one input of the gate 13, and the output of gate 12 is connected to the other input of the gate 13.

Reference 14 shows a line carrying the output of a crystal oscillator (not shown) for use in generating a reference signal to demodulate the signal on line 1. Line 14 is connected to the CLOCK input of another D-type bistable circuit 15 (type SN 74 LS 74 J) and to the CLOCK input of another UP/DOWN counter 16 (type SN 74LS191J). Logic '1' is applied to the SET and CLEAR inputs of bistable circuit 15. The $\overline{Q}$ output of bistable circuit 15 is connected to the CLOCK input of bistable circuit 9 and also to the LOAD input of UP/DOWN counter 16. Logic '0' is applied to the ENABLE (G) input, the DOWN/UP input, and the C and D inputs of counter 16. The output of NAND gate 12 is connected to the A input of counter 16 and the BORROW output of counter 11 is connected to the B input of counter 16. The QD output of counter 16 is connected to the COUNT UP input of another UP/DOWN counter 17 (type SN 74L 193J). The MAX/MIN output of counter 16 is connected the D input of bistable circuit 15.

Counter 17 has logic '0' applied to its CLEAR input and logic '1' to its COUNT DOWN input and D input. The QA, QB and QC outputs of counter 17 are connected respectively to the A, B and C inputs of that counter. The QC output is also connected to the D input of bistable circuit 5. The QD output of the counter 17 is connected by line 18 to the demodulation and filter circuits 2.

The output of the demodulation and filter circuits 2 is connected to one input of a further exclusive-OR gate 19, the other input of the gate 19 having logic '1' applied to it. The output of gate 19 is connected to a line 20, to one input of another exclusive -OR gate 21 and to one input of yet another exclusive -OR gate 22. The other input of gate 21 has logic '0' applied to it and the output of gate 21 is connected to the other input of gate 22. A 1 nanofarad capacitor C2 is connected from a +5 volt supply to the output of gate 21. A type SN 74L86J integrated circuit constitutes the gates 19, 21 and 22.

The output of gate 22 is connected to one input of each of two two-input NAND gates 24 and 25. Line 18 is connected to both inputs of a further NAND gate 26 and to the remaining input of gate 24. The output of NAND gate 26 is connected to the remaining input of gate 25. A type SN 74L00J integrated circuit constitutes the NAND gates 24, 25 and 26.

The output of gate 24 is connected to the UP input of a further UP/DOWN counter 27 (type SN 74L193J) and the output of gate 25 is connected to the DOWN input of that counter. Logic '0' is applied to the CLEAR input of counter 27 and the CARRY output is connected to the LOAD input of the counter 27. Logic '1' is appied to the A, B, C and D inputs of counter 27. The BORROW output of counter 27 is connected to the LOAD input of counter 17.

The operation of the demodulating signal generating circuit will now be explained. In the waveform diagrams a 'high' level represents logic '1' and a 'low' level represents logic '0'. Any readers not familiar with the characteristics of the particular integrated circuits listed above may consult "The TTL Data Book for Design Engineers" by Texas Instruments Limited.

Referring to FIG. 2, waveform 30 represents the signal on line 14 applied to the clock input of counter 16. Waveforms 31, 32, 33 and 34 represent the QA, QB, QC and QD outputs of counter 16 although it should be noted that the QA, QB and QC outputs are omitted from FIG. 1 as they are not connected to any other part of the circuit. The first counter content represented by waveforms 31 to 34 in the drawing is 1110 which changes to 1111 upon the next positive-going edge in waveform 30. When the content of counter 16 becomes 1111, logic '1' (see reference 35) is produced at its MAX/MIN output and the D input of bistable circuit 15 therefore has logic '1' applied to it. The next positive-going edge 36 in waveform 30 clocks bistable circuit 15 and the bistable circuit produces logic '0' on its $\overline{Q}$ output. This same edge 36 ends the production of logic '1' at the MAX/MIN output of counter 16 but the logic '1' level persists long enough for correct operation of the bistable circuit 15 as shown in waveform 37.

The logic '0' $\overline{Q}$ output of bistable circuit 15 loads the counter 16 and there are three possible load inputs, namely 0001, 0010 and 0011. The choice from amongst these three possible inputs is determined by the CARRY and BORROW outputs of counter 11. In the example marked 'A' in FIG. 2, 0001 is loaded into the counter 16.

The next positive-going edge 38 in waveform 30 clocks the bistable 15 and ends the 'load' condition of counter 16 so leaving it free to count subsequent positive-going edges in waveform 30 until it reaches its 1111 count and a MAX/MIN logic '1' output is produced again to initiate re-loading. The number of edges required to reach maximum count is, of course, dependent on the initial count or LOAD input. In examples B and C loading of the counter 16 with 0010 and 0011 respectively is shown. The load inputs of 0001, 0010 and 0011 are respectively equivalent to division ratios of 16, 15 and 14 when the QD output is compared with the CLOCK input of counter 16.

Referring to FIG. 3, the QD output of counter 16 is again illustrated but to a smaller scale and referenced 40. The $\overline{Q}$ output of bistable circuit 15 is shown as reference 41, the pulses in waveform 41 being drawn as mere spikes for simplicity in view of the small scale. Waveforms 42, 43, 44 and 45 are respectively the QA, QB, QC and QD outputs of counter 17 which is clocked by the QD output of counter 16. The QD output of counter 17 (line 18) is used to de-modulate the received signals on line 1.

Waveform 46 represents a signal on line 1 to be demodulated and it should be borne in mind that diphase transmission is a phase modulation or double-sideband suppressed-carrier system in which the modulating signal switches the phase of a carrier the frequency of which in hertz (fundamental frequency in the case of a squarewave carrier) is the same as the modulation rate in bauds. The waveform 45 is used as a recovered carrier for demodulating the waveform 46.

Waveform 45 is shown in incorrect phase alignment with waveform 46 in order to explain how the circuit achieves phase correction. Waveform 47 represents the output of OR-gate 3 with departures from rectangularity caused by the effect of capacitor C1. Waveform 48 represents the output of OR-gate 4 and is a series of narrow pulses (for simplicity shown as spikes) corresponding to transitions in waveform 46. These spikes are used to clock the bistable circuit 6 and waveform 46 represents the Q output of bistable circuit 6.

At the instant defined by reference 50, bistable circuit 6 has just been clocked by pulse 51 and its Q output therefore corresponds to the logic '1' applied to its D input. The next low-to-high transition (reference 52) in waveform 41 clocks bistable circuit 9 to give logic '0' at its $\overline{Q}$ output (waveform 54) in consequence of the logic '1' at its D input. This logic '0' $\overline{Q}$ output of bistable circuit 9 clears bistable circuit 6 and sets the Q output of bistable circuit 6 to logic '0'. The next low-to-high transition (reference 53) in waveform 41 clocks bistable circuit 9 and the Q output of that circuit becomes logic '0' in consequence of the logic '0' Q output of bistable circuit 6. An identical series of events occurs for each pulse in the waveform 48. Thus, waveform 54, the Q output of bistable circuit 9, is a series of pulses each pulse resulting from a pulse in the waveform 48. The purpose of the bistable circuit 6 and 9 is to generate more suitable pulses for driving a counter from the transition-representing pulses of waveform 41. This arrangement allows a counter of slower response than the one specified for counter 10 to be used if desired.

The QC output of counter 17 is applied to the D input of bistable circuit 5 which is clocked by the transition-representing pulses of waveform 48. When the alignment of the locally generated demodulating signal (QD line 18) and the signal for demodulation (line 1) is correct, transitions in the QC output of counter 17 align with transitions in the signal for demodulation. Should the alignment not be correct, the transitions will occur when the QC output of counter 17 is either logic '1' or logic '0' according to the sense of the misalignment. The Q output of bistable circuit 5 defines the state of the QC output of counter 17 at the last occurring transition in the signal for demodulation. Bistable circuit 5 thus serves to perform a phase comparison of the signal for demodulation and the QC output of counter 17, indicating merely whether the transitions are early or late. When the Q output of bistable circuit 5 is logic '1', gate 7 applies pulses corresponding to the Q output of bistable circuit 9 to the UP input of counter 10 but the output of gate 8 is a steady logic '1'. On the other hand, when the $\overline{Q}$ output of bistable circuit 5 is logic '1', gate 8 applies pulses corresponding to the Q output of bistable circuit 9 to the DOWN input of counter 10 but the output of gate 7 is a steady logic '1'. Waveform 55 represents the Q output of bistable circuit 5 for two examples, D and E, of phase misalignment of opposite sense.

The counter 10 counts up one for every transition in the signal for demodulation at which the demodulating signal is late as detected by use of the QC output of counter 17. The counter 10 counts down one for every transition in the signal for demodulation at which the demodulating signal is early. Every CARRY output pulse from counter 10 is counted up by counter 11 and every BORROW output pulse from counter 10 is counted down by counter 11. Both counters 10 and 11 are loaded whenever both inputs of NAND-gate 13 are logic '1' and this condition corresponds to the $\overline{Q}$ output of bistable circuit 9 being logic '1' and counter 11 producing either a carry or borrow pulse. The requirement that the $\overline{Q}$ output of bistable circuit 9 shall be logic '1' means that loading of the counters 10 and 11 occurs at the end of a count up or down pulse to counter 10. Counter 11 is re-loaded with the count it had during the count pulse just ending but counter 10 is loaded with 0000 if the demodulating signal was late at the last transition and loaded with 1111 if the demodulating signal was early at the last transition. The purpose of the counters 10 and 11 is to determine whether on average the demodulating signal is early or late with respect to the signal to be demodulated. Counter 11 will not overflow or underflow unless there is a definite trend to earliness or lateness since random jitter will cause the counters to count up as often as down.

The condition in which counter 11 neither overflows nor underflows corresponds to a load input of 0010 for counter 16. On the other hand, an overflow and an underflow of counter 11 correspond respectively to load inputs of 0011 and 0001 for the counter 16. Thus, if on average the demodulating signal is correctly aligned the counter 16 performs a divide-by-fifteen function but this is changed to divide-by-fourteen for one divide cycle of counter 16 if on average the demodulating signal is late and to divide-by-sixteen for one divide cycle of counter 16 if on average the demodulating signal is early.

The purpose of exclusive OR-gate 19 is to act as a buffer to provide a square-edged output of adequate fan out on line 20 from the demodulated, filtered and comparatored outputs of circuits 2. Exclusive OR-gates 21 and 22, NAND gates 24 to 26 and counter 27 are used to determine whether the demodulating signal (QD line 18) is correct or needs to be inverted. Inversion, if required, is achieved by loading counter 17 at a time when its Q D output is logic '0'. When counter 17 is loaded the QA, QB and QC outputs are re-set to the states previously attained but Q D output is set to logic '1'.

Exclusive OR-gates 21 and 22 and capacitor C2 are used as a transition detector in a similar manner to exclusive OR-gates 3 and 4 and capacitor C1. The gate 24 produces an output pulse whenever there is a transition in the data output and the demodulating signal is logic '1'. Gate 26 inverts the demodulating signal so that gate 25 produces an output pulse whenever there is a transition in the data output and the demodulating signal is logic '0'. The output pulses from gates 24 and 25 are counted up and down respectively by the counter 27. In correct operation the transitions in the data output occur when the demodulating signal is logic '1' and counter 27 repeatedly overflows and is re-loaded with 1111. On the other hand, if there are sufficient pulses from gate 25 to cause the counter 27 to count down to 0000 an underflow will occur and the BORROW output of counter 27 will load counter 17 to invert the QD output of the latter counter as described earlier. The counter 27 performs a time-averaging function on the outputs of gates 24 and 25 so that random jitter does not have an adverse effect on operation.

The counters 10 and 11 perform a time integration on the timing errors detected by bistable circuit 5. The advantage of this integration or averaging is that all phase discrepancies (even very small ones) can be taken into account since a correction is not applied until a trend has built up. Without this feature, correction signals would have to be restricted to timing discrepancies greater than a relatively large predetermined value otherwise excessive random jitter would be generated. It is an advantage of the described circuit that there is no need to filter out the data transitions in the signal on line 1 in order to use it for synchronisation. No significant error is introduced into the synchronisation process by not filtering out the data transitions and were this not so a substantially more complex circuit would be required.

The advantage of setting the division ratio by loading the counter 16 is that only a small amount of the logic circuitry needs to operate fast. Thus, to reduce expense and power consumption and the counters 10, 11 and 17, for example, can be realised in CMOS circuitry which is slower than TTL but cheaper and requires less power.

If desired, means can be provided to temporarily by-pass the averaging effect of counters 10 and 11 to allow rapid synchronisation after 'power up' of the circuit, the by-pass being removed thereafter.

If desired, substantially the whole of the modem could be realised as a single chip integrated circuit. Alternatively, a micro-computer could be used to control the whole of the modem and slow speed parts of the circuitry could take the form of real time software routines.

What is claimed is:

1. A demodulator arrangement having a demodulator and a digital phase locked loop responsive to input diphase digitally modulated signals to produce output signals which are applied to the demodulator for effecting the demodulation of the input signals, the phase locked loop including a multiplicity of digital counting stages arranged as a variable frequency divider to produce a frequency-divided output from a clock signal, the division ratio of the frequency divider being settable to either, or any one, of at least two values, a phase comparator arrangement to make repeated comparisons of the timing of transitions in the output of the frequency divider with the timing of transitions in the input signals, and to produce on each comparison a first signal if the frequency divider output is leading the input signals and a second signal if the frequency divider output is lagging the input signals, said timing comparison means comprising a first D-type bistable circuit and a transition detector circuit, the output of the transition detector circuit being connected to the CLOCK input of the bistable circuit, and the D input of the bistable circuit being connected to receive inputs at the times of transitions in the output of the frequency divider, counter means connected to the output of the timing comparison means to count in one direction in response to the first signal and to count in the opposite direction in response to the second signal, and division ratio setting means to set the division ratio at a first, higher, value if the value in the counter means exceeds a threshold in the one direction, and at a second lower value if the value in the counter means exceeds the threshold in the opposite direction, wherein the arrangement includes a phase adjustment circuit responsive to the output of the demodulator and the output signals of the digital phase locked loop to correct the phase of the output signals of the phase locked loop.

2. An arrangement according to claim 1 characterised in that the phase adjustment circuit is arranged to produce an output which is applied to the variable frequency divider to cause the output signal of the digital phase locked loop to execute a phase jump in response to a plurality of occurrences of an incorrect phase relationship between the output of the demodulator and the output signals of the digital phase locked loop.

3. An arrangement according to claim 1 characterised in that the phase adjustment circuit includes phase comparison means responsive to transitions in the output of the demodulator to produce pulse outputs dependent on the phase of the output signals of the digital phase locked loop, and a counter connected to count the pulse outputs upwards and downwards, the counter producing an output for causing the phase jump.

4. An arrangement according to claim 2 in which the state outputs of some of the more significant counter stages of the variable frequency divider but not the most significant stage are connected to preset inputs for the respective stages, a fixed input is applied to the preset input of the most significant stage, and the output from the phase adjustment circuit is applied to a load input of the counter stages to cause the stages to adopt the preset input states.

5. An arrangement according to claim 4 characterised in that the variable division of the clock signal is achieved by resetting the counter stages on reaching a predetermined value to an adjustable initial state which depends on the variable division factor required.

6. An arrangement according to claim 5, characterised in that the variable divider includes first and second counter circuits, with the state output of the most significant stage of the first counter circuit being applied as input to the second counter, the more significant stages being all stages of the second counter circuit, the predetermined value being the maximum possible value of the first counter circuit, and the adjustable state relating to stages of the first counter circuit only.

* * * * *